(12) United States Patent
Monk et al.

(10) Patent No.: US 10,819,353 B1
(45) Date of Patent: Oct. 27, 2020

(54) SPUR CANCELLATION IN A PLL SYSTEM WITH AN AUTOMATICALLY UPDATED TARGET SPUR FREQUENCY

(71) Applicant: Silicon Laboratories Inc., Austin, TX (US)

(72) Inventors: Timothy A. Monk, Hudson, NH (US); Douglas F. Pastorello, Hudson, NH (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 16/593,473

(22) Filed: Oct. 4, 2019

(51) Int. Cl.
*H03L 7/08* (2006.01)
*H03L 7/087* (2006.01)
*H03L 7/22* (2006.01)
*H03L 7/23* (2006.01)
*H03L 7/093* (2006.01)
*G01R 31/317* (2006.01)

(52) U.S. Cl.
CPC ........ *H03L 7/093* (2013.01); *G01R 31/31709* (2013.01); *H03L 7/0802* (2013.01)

(58) Field of Classification Search
CPC .. H03L 7/093; H03L 7/0802; G01R 31/31709
See application file for complete search history.

(56) References Cited

U.S. PATENT DOCUMENTS

| | | | |
|---|---|---|---|
| 5,576,666 A * | 11/1996 | Rauvola | H03L 1/02 327/105 |
| 6,515,525 B2 * | 2/2003 | Hasegawa | H03L 7/087 327/156 |
| 6,829,318 B2 * | 12/2004 | Kawahara | H03L 7/1976 327/148 |
| 7,061,276 B2 | 6/2006 | Xu | |
| 7,064,616 B2 | 6/2006 | Reichert | |
| 7,208,990 B1 | 4/2007 | Hassun | |
| 7,391,839 B2 | 6/2008 | Thompson | |
| 7,605,662 B2 | 10/2009 | Kobayashi et al. | |
| 7,746,972 B1 | 6/2010 | Melanson et al. | |
| 7,888,973 B1 * | 2/2011 | Rezzi | H03L 7/085 327/105 |
| 8,207,766 B2 | 6/2012 | Yu | |
| 8,390,348 B2 | 3/2013 | Burcea | |
| 8,427,243 B2 | 4/2013 | Chen et al. | |
| 8,497,716 B2 | 7/2013 | Zhang | |

(Continued)

OTHER PUBLICATIONS

Li, Y., et al., "On-Chip Spur and Phase Noise Cancellation Techniques," IEEE Asian Solid-State Circuits Conference, Nov. 6-8, 2017, pp. 109-112.

(Continued)

*Primary Examiner* — Kenneth B Wells
(74) *Attorney, Agent, or Firm* — Zagorin Cave LLP

(57) ABSTRACT

A spur target frequency is periodically determined to cancel a spur using a spur cancellation circuit in a first phase-locked loop (PLL) in a system with at least a second PLL that is in lock with the first PLL. The spur target frequency is periodically determined utilizing divide ratios of the first PLL and the second PLL to determine the updated spur target frequency. As one or more of the divide ratios change, the spur frequency changes and the spur target frequency is updated to reflect the change.

21 Claims, 8 Drawing Sheets

(56) References Cited

U.S. PATENT DOCUMENTS

| | | |
|---|---|---|
| 8,604,840 B2 | 12/2013 | Ahmadi et al. |
| 8,947,139 B1 | 2/2015 | Vercesi et al. |
| 8,957,712 B2 | 2/2015 | Tang et al. |
| 9,071,195 B2 | 6/2015 | Gabbay |
| 9,207,646 B2 | 12/2015 | Wang et al. |
| 9,246,500 B2 | 1/2016 | Perrott |
| 9,490,818 B2 | 11/2016 | Perrott |
| 9,762,250 B2 | 9/2017 | Perrott |
| 2008/0116946 A1 | 5/2008 | Masson |
| 2008/0129352 A1 | 6/2008 | Zhang |
| 2008/0218228 A1 | 9/2008 | Masson |
| 2009/0132884 A1 | 5/2009 | Suda et al. |
| 2009/0251225 A1 | 10/2009 | Chen et al. |
| 2010/0097150 A1 | 4/2010 | Ueda et al. |
| 2010/0213984 A1 | 8/2010 | Shin et al. |
| 2011/0025388 A1 | 2/2011 | Lamanna |
| 2011/0109356 A1 | 5/2011 | Ali et al. |
| 2011/0133799 A1 | 6/2011 | Dunworth et al. |
| 2011/0204938 A1 | 8/2011 | Lamanna |
| 2012/0161832 A1 | 6/2012 | Lee et al. |
| 2013/0050013 A1 | 2/2013 | Kobayashi et al. |
| 2013/0112472 A1 | 5/2013 | Welland |
| 2013/0222026 A1 | 8/2013 | Havens |
| 2013/0257494 A1 | 10/2013 | Nikaeen et al. |
| 2014/0077849 A1 | 3/2014 | Chen et al. |
| 2014/0211899 A1 | 7/2014 | Furudate |
| 2014/0266341 A1 | 9/2014 | Jang et al. |
| 2015/0145567 A1 | 5/2015 | Perrott |
| 2015/0145571 A1 | 5/2015 | Perrott |
| 2015/0207514 A1 | 7/2015 | Kim et al. |
| 2015/0008961 A1 | 8/2015 | Kim et al. |
| 2016/0112053 A1 | 4/2016 | Perrott |
| 2016/0359493 A1 | 12/2016 | Chen et al. |
| 2019/0068205 A1 | 2/2019 | Tamura et al. |

OTHER PUBLICATIONS

U.S. Appl. No. 16/018,598, entitled "Spur Cancellation for Spur Measurement," filed Jun. 26, 2018, by Timothy A. Monk and Rajesh Thirugnanam.

U.S. Appl. No. 16/143,717, entitled "Spur Cancellation with Adaptive Frequency Tracking," filed Sep. 27, 2018, by Timothy A. Monk and Rajesh Thirugnanam.

U.S. Appl. No. 16/143,711, entitled "Spur Canceller with Multiplier-Less Correlator," filed Sep. 27, 2018, by Timothy A. Monk and Rajesh Thirugnanam.

Avivi, R., et al., "Adaptive Spur Cancellation Technique in All-Digital Phase-Locked Loops," IEEE Transactions on Circuits and Systems-II: Express Briefs, vol. 64, No. 11, Nov. 2017, pp. 1292-1996.

Ho, C., and Chen, M., "A Fractional-N DPLL With Calibration-Free Multi-Phase Injection-Locked TDC and Adaptive Single-Tone Spur Cancellation Scheme," IEEE Transactions on Circuits and Systems-I: Regular Papers, vol. 63, No. 8, Aug. 2016, pp. 1111-1122.

Gupta, M. and Song, B.S., "A 1.8GHz Spur Cancelled Fractional-N Frequency Synthesizer with LMS Based DAC Gain Calibration," IEEE International Solid-State Circuits Conference, vol. 41, No. 12, Dec. 2006, pp. 2842-2851.

Hedayati, H. et al., "A 1 MHz Bandwidth, 6 GHz 0.18 µm CMOS Type-I $\Delta\Sigma$ Franctional-N Synthesizer for WiMAX Applications," IEEE Journal of Solid State Circuits, vol. 44, No. 12, Dec. 2009, pp. 3244-3252.

Hedayati, H. and Bakkaloslu, B., "A 3GHz Wideband $\Sigma\Delta$ Fractional-N Synthesizer with Voltage-Mode Exponential CP-PFD", IEEE Radio Frequency Integrated Circuits Symposium, 2009, pp. 325-328.

Hsu, C.M. et al., "A Low-Noise Wide-BW 3.6-GHz Digital $\Delta\Sigma$ Fractional-N Frequency Synthesizer with a Noise-Shaping Time-to-Digital Converter and quantization Noise Cancellation," IEEE Journal of Solid-State Circuits, vol. 43, No. 12, Dec. 2008, pp. 2776-2786.

Menninger, S. and Perrott, M., "A 1-MHz Bandwidth 3.6-GHz 0.18µm CMOS Fractional-N Synthesizer Utilizing a Hybrid PFD/DAC Structure for Reduced Broadband Phase Noise," IEEE Journal of Solid-State Circuits, vol. 41, No. 4, Apr. 2006, pp. 966-980.

Pamarti et al., "A wideband 2.4GHz Delta-Sigma Fractional-N PLL with 1 Mb/s In-Loop Modulation," IEEE Journal of Solid-State Circuits, vol. 39, No. 1, Jan. 2004, pp. 49-62.

Staszewski, R.B. et al., "All-Digital PLL and Transmitter for Mobile Phones," IEEE Journal of Solid-State Circuits, vol. 40, No. 12, Dec. 2005, pp. 2469-2482.

Staszewski, R.B. et al., "1.3 V, 20 ps Time-to-Digital Converter for Frequency Synthesis in 90-nm CMOS," IEEE Transactions on Circuits and Systems-II, Express Briefs, vol. 53, No. 3, Mar. 2006, pp. 220-224.

Straayer, M.Z. and Perrott, M.H., A 12-Bit, 10-MHz Bandwidth, Continuous-Time $\Sigma\Delta$ ADC With a 5-Bit, 950-MS/s VCO-Based Quantizer, IEEE Journal of Solid-State Circuits, vol. 43, No. 4, Apr. 2008, pp. 805-814.

Swaminathan et al., "A Wide-Bandwidth 2.4 GHz ISM Band Fractional-N PLL with Adaptive Phase Noise Cancellation", IEEE Journal of Solid-State Circuits, vol. 42, No. 12, Dec. 2007, pp. 2639-2650.

Temporiti, E. et al., "A 700kHz Bandwith $\Sigma\Delta$ Fractional Synthesizer with Spurs Compensation and Linearization Techniques for WCDMA Applications," IEEE Journal of Solid-State Circuits, vol. 39, No. 9, Sep. 2004, pp. 1446-1454.

\* cited by examiner

| Freq Look-up | Phase | Squelch |
|---|---|---|
| F0 | Phase0 | Squelch0 |
| F1 | Phase1 | Squelch1 |
| F2 | Phase2 | Squelch2 |
| F3 | Phase3 | Squelch3 |
| F4 | Phase4 | Squelch4 |
| F5 | Phase5 | Squelch5 |
| F6 | Phase6 | Squelch6 |
| F7 | Phase7 | Squelch7 |
| F8 | Phase8 | Squelch8 |
|  | Phase9 | Squelch9 |

FIG. 9

SPUR CANCELLATION IN A PLL SYSTEM WITH AN AUTOMATICALLY UPDATED TARGET SPUR FREQUENCY

BACKGROUND

Field of the Invention

This invention relates to spur cancellation and more particularly to updating the target spur cancellation frequency.

Description of the Related Art

Signals generated by phase-locked loops and other timing circuits can include undesirable spurious tones. Canceling these spurious tones can improve the output of the timing circuits. Accordingly, improved techniques for canceling spurious tones are desirable.

SUMMARY OF EMBODIMENTS OF THE INVENTION

Accordingly, in an embodiment a method includes determining a spur frequency control word in a system having one or more phase-locked loops (PLLs) to cancel a spur at a spur target frequency corresponding to the spur frequency control word. The method includes determining an updated spur frequency control word based on a change in one or more variable divide ratios associated with at least one of the one or more PLLs and cancelling an updated spur at an updated spur target frequency corresponding to the updated spur frequency control word.

In another embodiment an apparatus includes one or more phase-locked loops including a first phase-locked loop (PLL). Spur frequency control word update logic generates a spur frequency control word. The spur frequency control word update logic is configured to supply an updated spur frequency control word that differs from the spur frequency control word based on a change in one or more variable feedback divide ratios associated with at least one of the one or more PLLs.

In another embodiment a method includes periodically determining a spur frequency control word to cancel a spur at a frequency corresponding to the spur frequency control word using a spur cancellation circuit in a first phase-locked loop (PLL) in a system with at least a second PLL that is in lock with the first PLL. The method periodically determines the spur frequency control word utilizing one or more first divide ratios of one or more first dividers of the first PLL and one or more second divide ratios of one or more second dividers of the second PLL. The spur frequency control word changes in response to a change in one or more of the one or more first divide ratios. The spur frequency control word changes in response to a change in one or more of the one or more second divide ratios. The spur frequency control word changes in response to a change in both one or more of the one or more first divide ratios and a change in one or more of the one or more second divide ratios.

BRIEF DESCRIPTION OF THE DRAWINGS

The present invention may be better understood, and its numerous objects, features, and advantages made apparent to those skilled in the art by referencing the accompanying drawings.

FIG. 9 illustrates an example lookup table used to compensate for PLL dynamics based on the updated spur target.

The use of the same reference symbols in different drawings indicates similar or identical items.

DETAILED DESCRIPTION

Embodiments described herein relate to a spur, or tone cancellation system or circuit such as one incorporated in a high-performance fractional-N highly-digital phase-locked loop (PLL). One such PLL is described in U.S. Pat. No. 9,762,250, entitled "Cancellation of Spurious Tones Within A Phase-Locked Loop With A Time-To-Digital Converter", filed Jul. 31, 2014, naming Michael H. Perrott as inventor, which patent is incorporated herein by reference.

Figure 1:
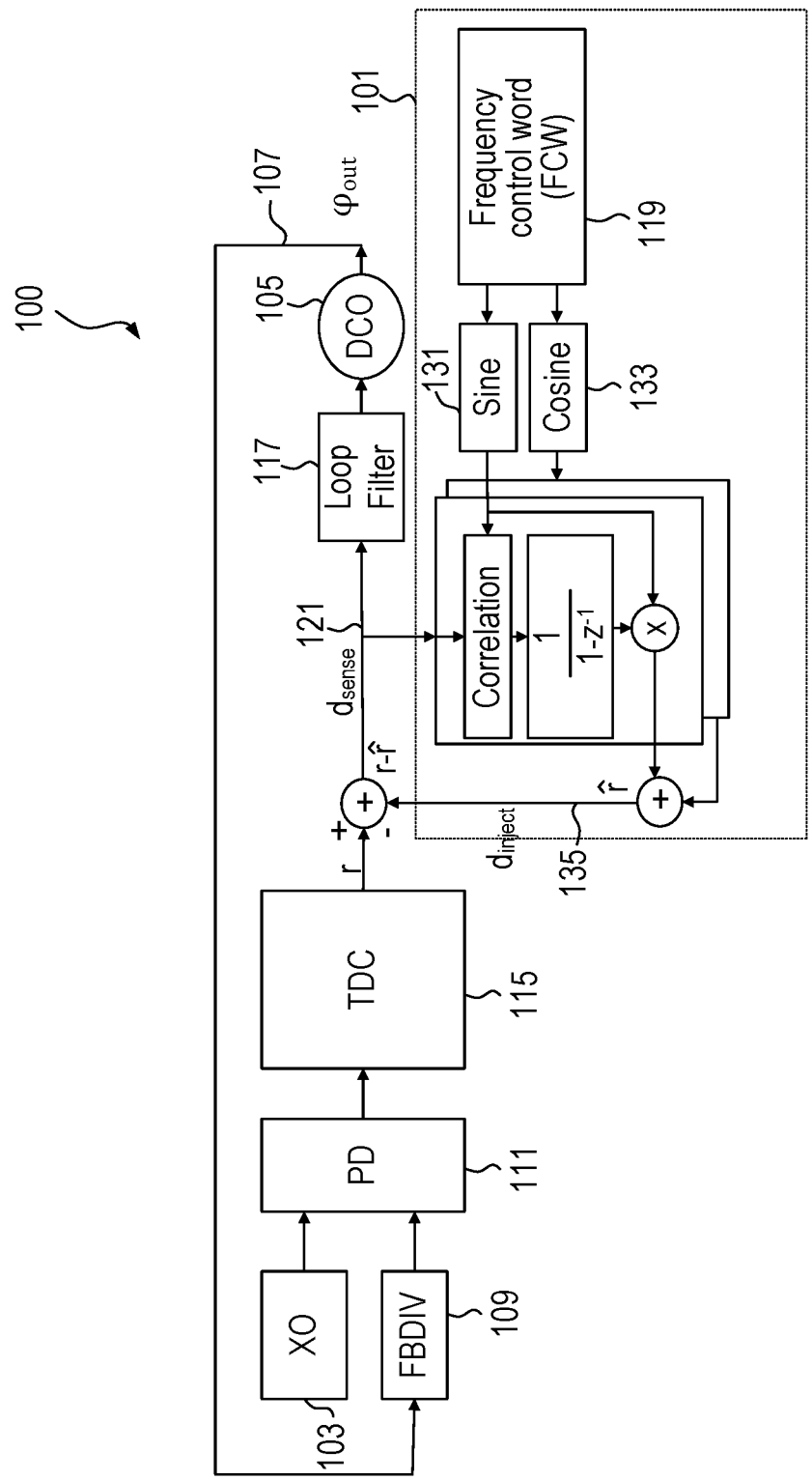
FIG. 1 illustrates a high level block diagram of a PLL with a spur cancellation circuit.

FIG. 1 illustrates a high level block diagram of a PLL 100 with a spur cancellation circuit 101. The PLL 100 receives a reference clock signal from crystal oscillator (XO) or other clock source 103. A digitally controlled oscillator (DCO) 105 supplies an output signal 107, which is fed back through feedback divider 109 to the phase detector 111. The phase detector supplies a time to digital converter circuit 115, which supplies a signal r that has a spurious tone (spur) canceled by the spur cancellation circuit 101 before being supplied to the loop filter 117.

The spur cancellation circuit receives a frequency control word (FCW) 119 that identifies the target spur of interest (target spur frequency) to be canceled. In the spur cancellation circuit 101, sine and cosine terms 131 and 133 at the programmable target frequency are correlated against a sense node, $d_{sense}$, 121 inside the PLL. The resulting error signals drive a pair of accumulators, which set the weights on the sine and cosine signals, producing a spur cancellation signal, $d_{inject}$ 135. Negative feedback drives the amplitude and phase of the cancellation signal to be such that no spur appears (or the spur is significantly reduced) in the PLL output signal 107.

Figure 2:
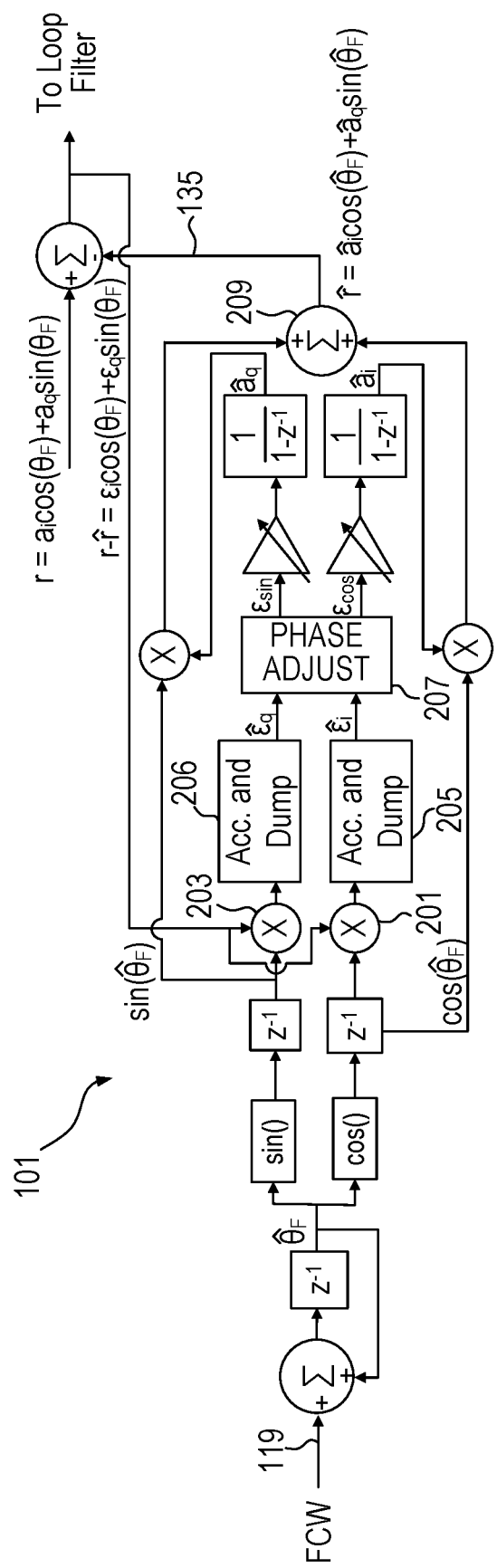
FIG. 2 illustrates an embodiment of the spur cancellation circuit in more detail.

FIG. 2 illustrates an embodiment of the spur cancellation circuit 101 in more detail. In the embodiment of FIG. 2, the two correlators are respectively implemented with high-resolution multipliers 201 and 203 and accumulate-and-dump circuits 205 and 206. The accumulate and dump circuits 205 and 206 average a number of samples by accumulating samples over the chosen measurement time frame (N samples) and then "dumping" the resulting value. A phase adjust block 207 follows the accumulate and dump circuits to compensate for PLL dynamics. The final weights on the sine and cosine terms are $\hat{a}_q$ and $\hat{a}_i$, which are the scale factors for the sine and cosine components of the cancellation signal. The weights multiply the sine and cosine terms (sin $\hat{\theta}_F$ and cos $\hat{\theta}_F$) and summer 209 sums together the multiplication results and supplies the spur cancellation signal $d_{inject}$ ($\hat{r}$ in FIG. 2) to cancel the spurious tone at the frequency specified by FCW. Note that the spur cancellation circuit can be implemented digitally.

In many applications the spur frequency tracks the spur cancellation circuit's main clock signal. However, in other applications such as jitter-attenuating clock applications with multiple asynchronous inputs or in the presence of an external interferer, the spur frequency does not track the spur cancellation circuit's main clock signal. In such situations, absent adaptive tracking of the spur frequency, the spur cancellation circuit does not accurately target the spur frequency resulting in a reduced quality of the spur cancellation. Further, multiple spurs may also diminish the quality of the spur cancellation.

In the spur canceller shown in FIGS. 1 and 2, the spur frequency needs to be related to the reference frequency on which the cancellation frequency is based. In one embodiment, the spur frequency is based in part on the clock frequency at which the spur canceller operates. For many frequency synthesis applications, that is an appropriate constraint as all signals in the system are frequency locked to each other. In other applications, such as jitter-attenuating clocks with multiple inputs that may be asynchronous, or in the presence of an external interferer, the spur frequency may not track the spur canceller clock frequency. In that case, effective spur cancellation must allow for relative spur frequency variation. If the variation is small, it can be tracked by allowing the spur canceller adaptation bandwidth to increase. In this way, the phase of the cancellation signal can ramp according to the difference between the programmed spur frequency and the actual spur frequency. However, that may degrade the quality of the cancellation due to a lower signal to noise ratio (SNR) as the noise bandwidth also increases. Also, when operating on a spur that is not targeted properly, the integrators operate on an error signal that is above DC, where their effectiveness may be greatly reduced, reducing the quality of cancellation. Additionally, in the presence of multiple spurs that are closely spaced, a wide-bandwidth spur canceller may become confused by the additional spur.

Figure 3:
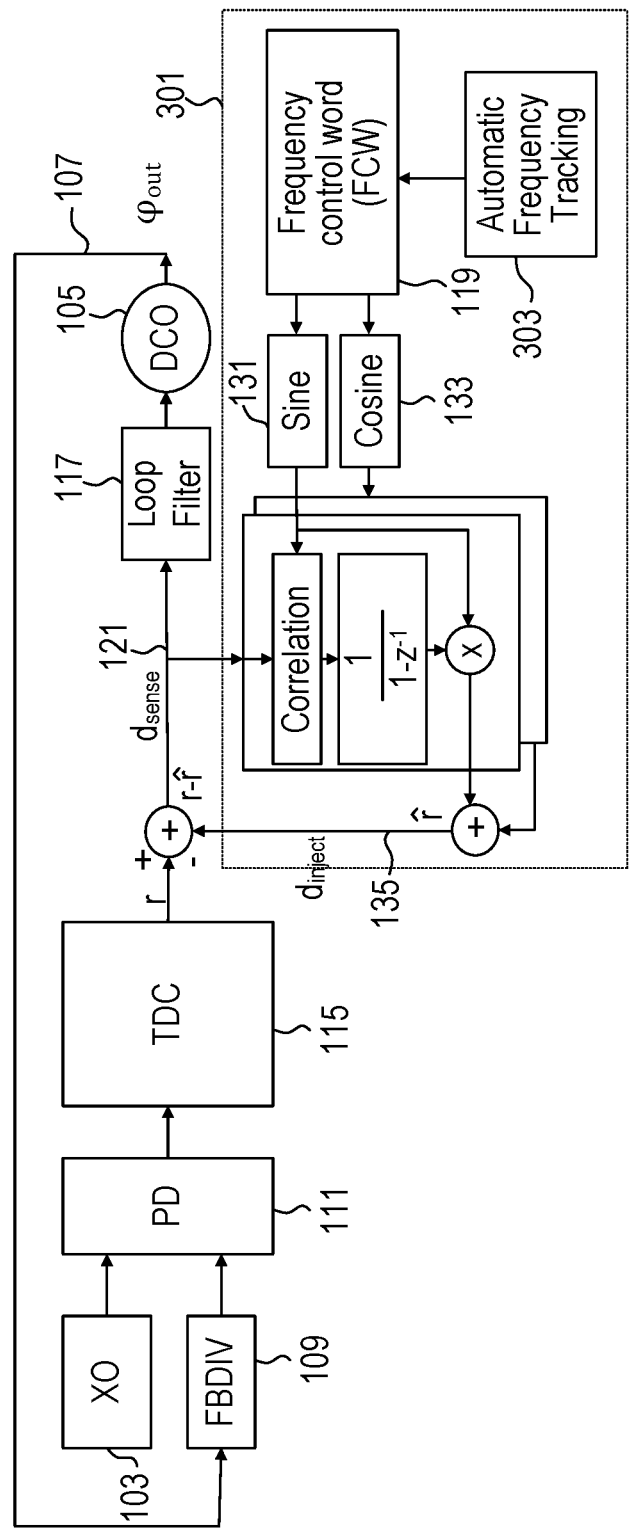
FIG. 3 illustrates an embodiment of a spur canceller in which the spur target frequency is automatically updated.

Embodiments described herein track the spur location directly and automatically update the target frequency of the spur being canceled as the spur frequency changes over time. FIG. 3 illustrates an embodiment of a spur canceller 301 in which the FCW is automatically updated by the use of the automatic spur frequency tracking circuit 303, which tracks movement in spur frequency over time. The spur frequency canceller shown in FIG. 3 is similar to those shown in FIGS. 1 and 2, except for the automatic spur frequency tracking. The automatic spur frequency tracking is described in more detail herein. The automatic spur frequency tracking circuit 303 may be advantageously used in a system 400.

Figure 4:
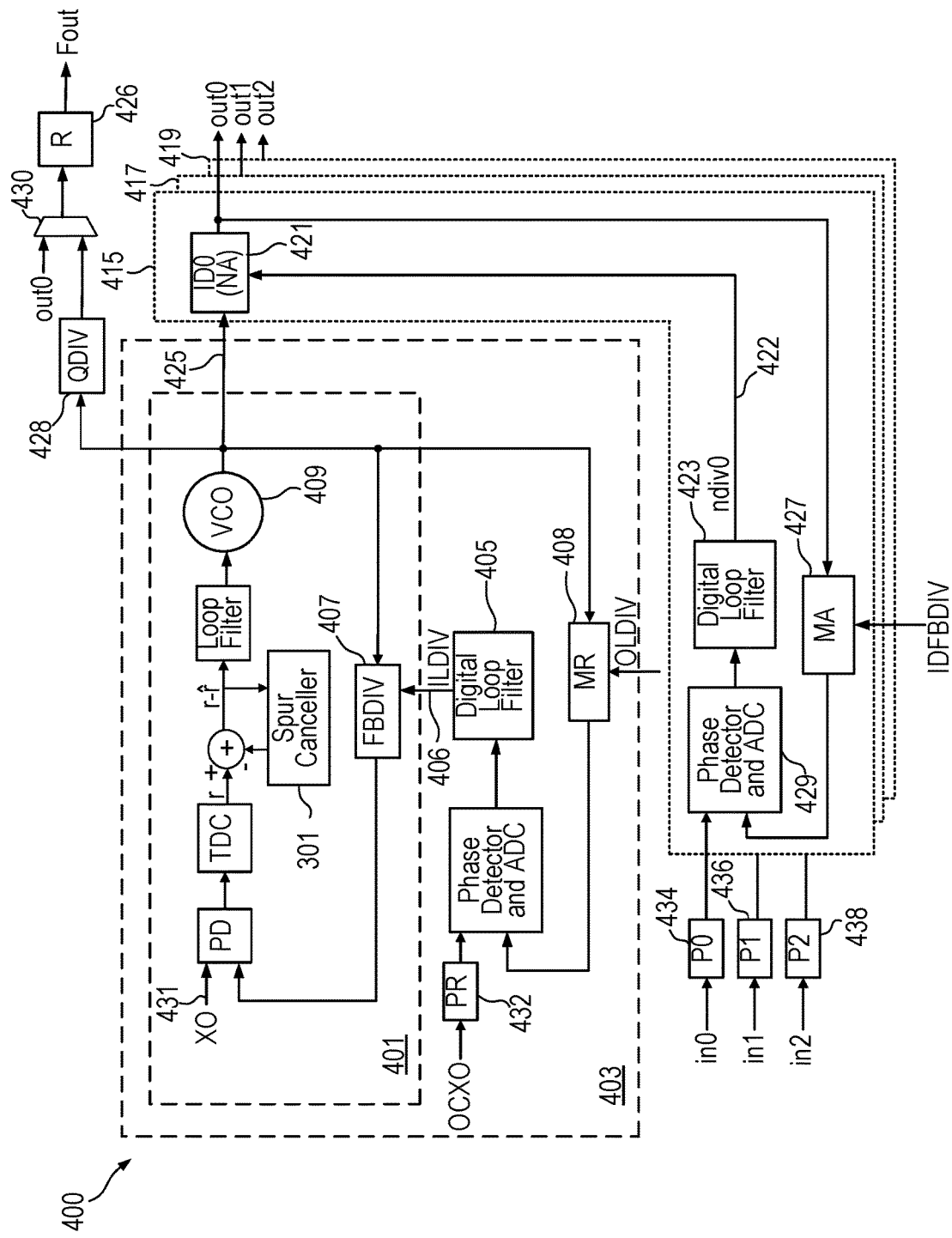
FIG. 4 illustrates an embodiment of a system in which multiple PLLs are coupled through their input and output signals.

FIG. 4 illustrates an embodiment of a system 400 in which multiple PLLs are coupled through their input and output signals. In the embodiment of system 400, an inner loop 401 and outer loop 403 are locked. The output of the digital loop filter 405 supplies the inner loop divider signal (ILDIV) 406 that controls the feedback divider FBDIV 407 of the inner loop 401. Feedback divider MR 408 receives the output signal of VCO 409 of the inner loop 401. In addition, loops 415, 417, and 419 are coupled to the output of VCO 409. Loop 415 utilizes an interpolative divider 0 (ID0) 421 that receives its divide signal ndiv0 422 from digital loop filter 423 that specifies the divide ratio NA of ID0 causing ID0 to divide the ID0 input signal 425 by NA. The embodiment of FIG. 4 also includes an optional fixed divider QDIV 428 that divides the output of VCO 409. Other embodiments may include additional fixed dividers on the inputs and outputs of the various PLLs or none at all.

Figure 5:
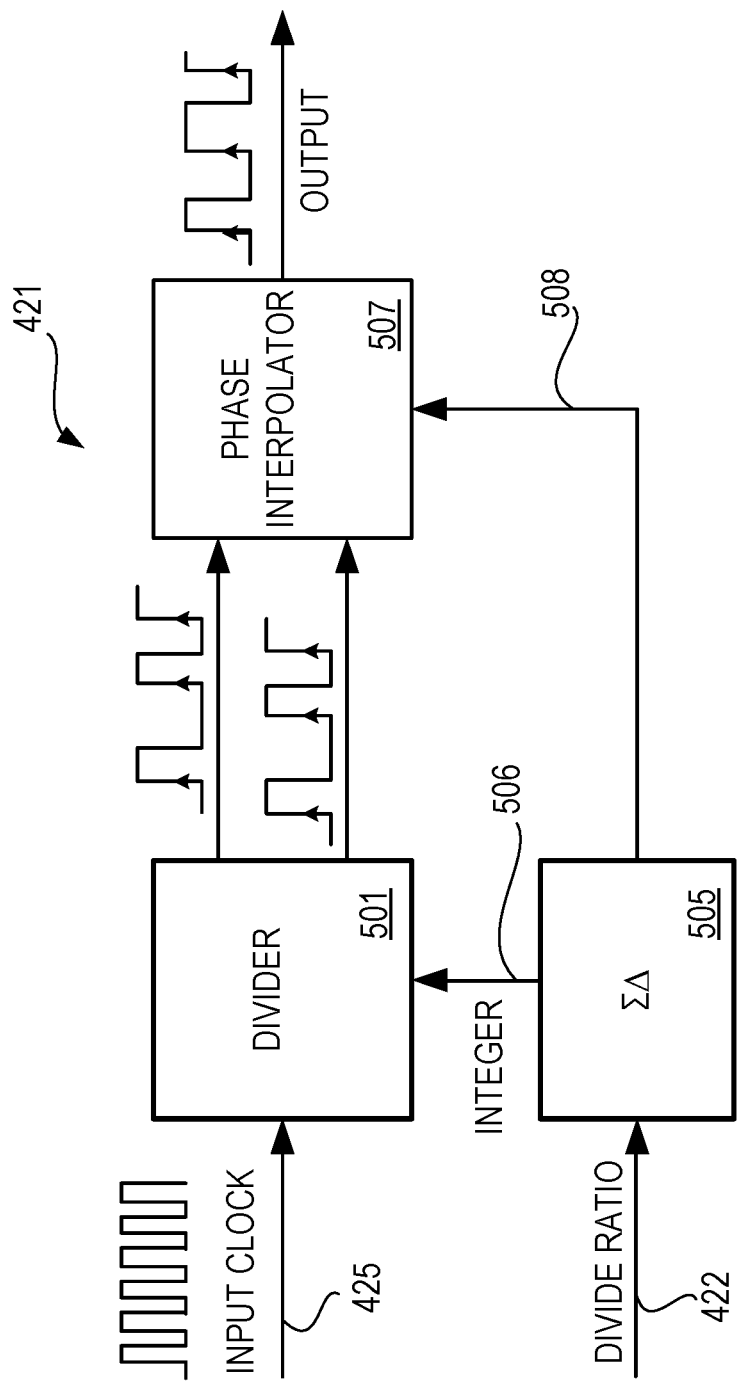
FIG. 5 illustrates an example of an interpolative divider used in the system of FIG. 4.

FIG. 5 illustrates an embodiment of an interpolative divider 421. The divider includes a multi-modulus divider 501, which receives the input clock signal 425. A first order sigma delta modulator 505 receives the digital divide ratio 422 (ndiv0), which divide ratio may be non-integer. The multi-modulus divider 501 receives a divide control signal 506 in a stream of integers that approximates the actual divide ratio. Thus, the integer portion of the divide ratio is supplied to the divider 501. The digital quantization error is supplied to the digitally controlled phase interpolator 507. Phase interpolator 507 cancels the jitter introduced by the divider 501 using interpolation based on the digital quantization error 508 supplied by the sigma delta modulator 505 by interpolating between two phases of the divided clock signal supplied by divider 501. Thus, the input clock signal is divided down by the divider 501 according to the control information provided by the sigma delta modulator 505. The phase interpolator 507 cancels the quantization errors in the output of the multi-modulus divider 501. An interpolative divider is further described in U.S. Pat. No. 7,839,225, filed Aug. 25, 2008, entitled "Direct Digital Interpolative Synthesis", naming Yunteng Huang as inventor, which patent is incorporated herein by reference in its entirety.

Referring again to FIG. 4, ID0 421 divides the input signal 425 by a divide ratio NA. Loop 415 receives an input signal in0 at the phase detector and analog to digital converter 429 and feeds back the output of ID0 421 through the feedback divider MA 427. Loop 415 supplies an output signal out0. Loops 417 and 419 are configured similarly to loop 415 and receive respectively input signals in1 and in2 and supply respectively output signals out1 and out2. While not shown, loop 417 has an interpolative divider ID1 with divide ratio NB and a feedback divider MB.

The system 400 further includes the spur canceller 301 with automatic spur frequency tracking. The spur canceller 301 relies on knowing the spur coupling mechanism of the various loops, at least to the extent of what frequencies interact to cause the spur. That knowledge is combined with information available in the frequency synthesis system about the precise actual frequencies present by observing the instantaneous divide values in use. These divide ratios are nominally known based on the configuration. However, the divide values may change in response to a control input of the system, or as part of normal operation of the PLLs in response to minor changes in the clock and reference inputs. For example, XO frequency will drift across temperature. That drift will result in a minor change to the value of FBDIV in feedback divider 407, to maintain the output of VCO 409 at the desired frequency. The change in divide values for one or more dividers affects the ratio of the clock signals in the system and therefore the spur frequency.

For example, the divide ratios of feedback dividers FBDIV 407, MR 408, and/or MA 427 might change during system operation. In addition, the divide ratio NA of the interpolative divider loop 415 as well the divide ratios of the interpolative dividers in loops 417 and 419 might change during system operation. In addition, the system of FIG. 4 may include various fixed dividers (such as dividers 426, 428, 432, 434, 436, 438) on various ones of the input and output clock signals. When all PLLs are in lock, the divide values set the frequency relationships between their inputs and outputs. A spur involving an output or input to which one of the PLLs in the system in locked can be expressed as: $F_{spur}=\text{abs}(i \cdot F_1 - j \cdot F_2)$, where i and j are the harmonics of the two frequencies F1 and F2 that interact and abs is absolute value. In embodiments, F1 and F2 can be related to the reference frequency on which the cancellation signal is based via the observed divide ratios. In an embodiment, the spur canceller operates using one or more clock signals such as the output of the feedback divider FBDIV 407, the input reference clock signal 431, or another suitable clock signal and F1 and F2 are related via the observed divide ratios to one of the spur canceller's clock signals. In an embodiment, the frequency control word (FCW) supplied to the spur cancellation circuit is $$FCW = \frac{F_{spur}}{F_{ref}},$$

where $F_{ref}$ in FIG. 4 is the frequency $F_{XO}$ of the reference clock signal 431. As an example of how output frequencies relate to input frequencies based on divide ratios from FIG. 4, $$\frac{F_{out0}}{F_{xo}} = \frac{FBDIV}{NA \times QDIV},$$

where $F_{out0}$ is the frequency of out0 from interpolative divider 421, $F_{XO}$ is the frequency of the XO signal 431, FBDIV is the divide ratio of feedback divider 407, and NA is the divide ratio of interpolative divider 421. Note that there may be additional fixed dividers that factor into the computation of $F_{spur}$ that can be precomputed as explained further herein.

Figures 6, 7:
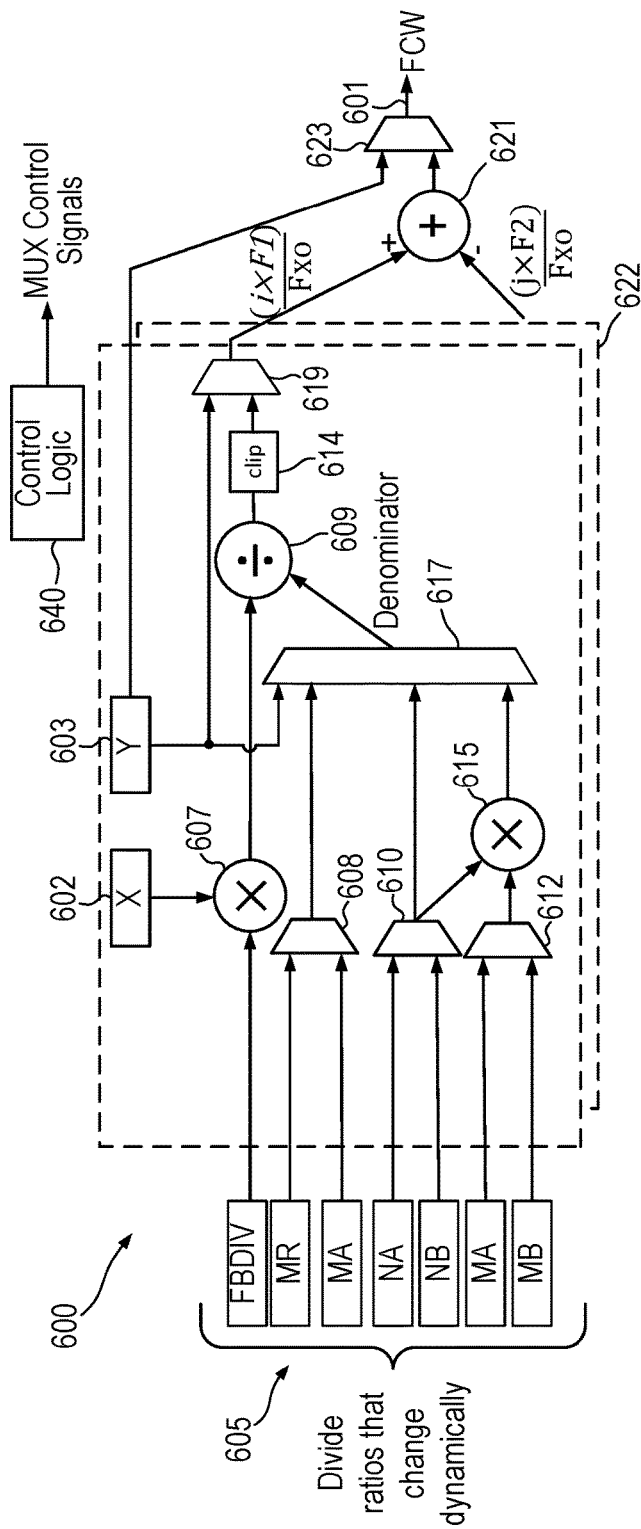
FIG. 6 illustrates an embodiment of a computation engine used to determine the desired frequency control (FCW) that identifies the target spur to the spur cancellation circuit.
FIG. 7 is a table with several examples of how the computation engine is configured for various signals of interest.

FIG. 6 illustrates an embodiment of a computation engine 600 used to determine the desired frequency control (FCW) 601. X and Y registers 602 and 603 store the precomputed portions of the FCW. The precomputed portions may be, e.g., the harmonics i and j, or fixed divider values. The bit widths of the divide ratios are determined such that the final FCW is calculated with an error much less than the spur cancellation bandwidth, ensuring good cancellation. Registers 605 store the divide ratios that change dynamically including divide ratios FBDIV, MR, MA, NA, MB, and NB, where FBDIV, MR, MA, NA are shown in FIG. 4 and MB and NB represent the divide ratios respectively associated with the feedback divider and interpolative divider of interpolative divider loop 417 of FIG. 4.

In the computation engine 600, multiplier 607 multiplies FBDIV by a constant stored in the X register 602. The multiplication result is then provided to divider 609. Multiplexer 617 supplies the denominator to divider 609. Multiplexer 617 selects from various ones of the divide ratios that dynamically change. Multiplexer 617 may also select a multiplier result of multiplying an N divider ratio (NA or NB) by an M divider ratio (MA or MB) where NA and NB are respective interpolative divider divide ratios from interpolative divider loops 415 and 417 and MA and MB are respective feedback divider ratios from interpolative divider loops 415 and 417. While not shown in FIG. 6 for ease of illustration, other embodiments may also select divide ratios of interpolative divider loop 419. The clip block 614 keeps the fractional part of the result generated by divider 609. Multiplexer 619 receives the division result from divider 609 through the clip block 614. Multiplexer 619 selects between the division result and a fixed value from the Y register 603. The divider output selected by multiplexer 619 is $$\frac{i \times F1}{F_{xref}},$$

where $F_{xref}$ in the context of FIG. 4 is $F_{XO}$, the frequency of the crystal oscillator signal 431 provided as the reference clock input to the inner loop 401, which is the PLL in which the spur canceller circuit resides. Multiplexer 619 supplies its output $$\left(\frac{i \times F1}{F_{xref}} \text{ or a constant}\right)$$

to summer 621 which generates FCW 601 as $$\frac{Fspur}{F_{xref}}$$

by subtracting $$\frac{j \times F2}{F_{xref}}$$

supplied from another instantiation 622 of the computation engine 600. Note that the same logic can be used to generate both $$\frac{i \times F1}{F_{xref}} \text{ and } \frac{j \times F2}{F_{xref}}$$

as long as the updated spur frequency can be supplied by computation engine 600 at the desired update rate. F1 represents the frequency of a first input or output signal of interest and F2 represents the frequency of another input or output frequency of interest. The X register 602 stores the harmonic i $$\left(\text{and } j \text{ for the instantiation to generate } \frac{j \times F2}{F_{xref}}\right).$$

Note that multiplexers 619 and 623 allow the computations for one or both of the signals of interest to be bypassed. Such configurations may be used in testing or in embodiments where spur cancellation is not used some, or all of the time. Note that in embodiment illustrated in FIG. 6, where at most only two of the inputs 605 are used, alternative multiplexing schemes can be utilized that provide a more efficient circuit implementation.

In an embodiment, the FCW is updated every 1 microsecond, which is sufficient to track slow changes in spur frequency. If the spur moves quickly, the cancellation target frequency will lag behind, but will catch up eventually and target the desired spur frequency. The maximum trackable speed is a function of both the update rate, as well as the PLL bandwidths, which control the various dividers under observation. Other embodiments utilize a different FCW update rate to track the spur frequency.

The table in FIG. 7 shows several examples of how the computation engine is configured for various signals of interest. In the table, the left column 701 contains the signal of interest, column 703 shows the desired calculation to be performed by the computation hardware 600, column 705 illustrates the calculation form showing the configuration of the computation engine, column 707 shows the contents of the X register and column 709 shows the contents of the Y register.

As an example, assume the signal of interest 711 is the output signal supplied by the fixed divider QDIV 428 with a divide ratio Q (see FIG. 4) through the fixed divider 426 with the divide ratio R. In this instance, the R divider 426 is supplied with the output of the QDIV divider 428 through selector circuit 430. The desired calculation can be seen to be $$i \times \frac{FBDIV}{Q \times R}.$$

That represents $$i \times \frac{F_{OUT}}{F_{XO}},$$

where $F_{OUT}$ is the frequency of the signal supplied by the fixed R divider 426 and $F_{XO}$ is the frequency of the input signal 431. Generally, the divider 426 receives the output of QDIV 428 or the output (out0) of ID0 421 through selector circuit 430. The computation engine calculates $$X \times \frac{FBDIV}{Y}.$$

Thus, the computation engine is configured to multiply the contents of the X register 602 (which is the harmonic i) by FBDIV in multiplier 607 and divide that value by the contents of the Y register, which is Q×R, where Q is the fixed divide ratio of fixed divider QDIV 428 and R is a divide ratio of the fixed divider 426.

A second example of a signal of interest 715 (Output through OID) is the output from one of the output interpolative dividers. The desired calculation can be seen to be $$i \times \frac{FBDIV}{N \times R}.$$

That represents $$i \times \frac{F_{OUT}}{F_{XO}},$$

where $F_{OUT}$ is me frequency of the signal supplied by the R divider 428 as supplied by the ID 421 through selector circuit 430 in FIG. 4, N is the interpolative divider divide ratio, e.g. divide ratio NA of ID 421, and $F_{XO}$ is the frequency of the input reference signal 431. The computation engine calculates $$X \times \frac{FBDIV}{N}.$$

Thus, the computation engine multiplies the contents (i/R) of the X register 602 by FBDIV in multiplier 607, where i is the harmonic of interest and R is a divide ratio of the fixed divider 426. Multiplexer 610 selects NA or NB and multiplexer 617 selects the denominator from multiplexer 610 to configure the computation engine 600 to generate $$\frac{i \times F1}{F_{XO}}.$$

A third example of a signal of interest 717 is the input signal IN-PLL 403, which is the input signal to the outer loop 403. The desired calculation in the table of FIG. 7 can be seen to be $$i \times PR \times \frac{FBDIV}{MR},$$

where MR is the divide ratio of feedback divider 408 and PR is the divide ratio of the input divider 432 between the OCXO and the phase detector. That represents $$i \times \frac{F_{IN}}{F_{XO}},$$

where $F_{IN}$ is $F_{OCXO}$. The computation engine is configured to calculate $$X \times \frac{FBDIV}{MR}.$$

The computation engine is configured to multiply the contents (i×PR) of the X register 602 by FBDIV in multiplier 607, where i is the harmonic of interest and PR is the ratio of divider 432. Multiplexer 608 selects MR and multiplexer 617 selects the denominator from multiplexer 608 to configure the computation engine 600.

A fourth example of a signal of interest 719 is the input signal INx-PLL-IDx, which is an input signal (in0 or in1) to one of the interpolative divider loops 415 or 417). For ease of illustration, the dividers associated with ID loop 419 is not shown in FIG. 7. The desired calculation in the table of FIG. 7 can be seen to be $$i \times P \times \frac{FBDIV}{N \times M},$$

where N (either NA or NB in FIG. 6) is the divide ratio of the interpolative divider and M (either MA or MB) is the divide ratio of feedback divider 427 in one of the interpolative divider PLLs 415 or 417. The computation engine multiplies the contents (i×P) of the X register 602 by FBDIV in multiplier 607, where i is the harmonic of interest and P is the fixed divider value, e.g., of fixed input divider P0 434 (or divider (P1) 436) in FIG. 4, which supplies ID loop 417).

Multiplexer 610 selects NA (or NB) and multiplexer 612 selects the corresponding MA (or MB). The multiplexers 610 and 612 supply their outputs to multiplier 615. Multiplexer 617 selects the output of multiplier 615 as the denominator for divider 609 in order to generate $$\frac{i \times F1}{F_{XO}}.$$

Finally, the last signal of interest 721 in the table in FIG. 7 is INx-PLL 401. The desired calculation can be seen to be ix P. The computation engine calculates Y, where Y is 0. Thus, multiplexer 619 bypasses the multipliers and dividers to select the Y register, which has a value of zero. Thus, e.g., F1 (or F2) is set at 0.

Embodiments can configure the computation engine in additional ways not illustrated in the table in FIG. 7. For example, multiplexer 623 may select the Y register to provide a fixed spur frequency target stored in the Y register.

Thus, various examples illustrate several different possible configurations of the computation engine. $F_1$ will be one signal of interest and $F_2$ will be a different signal of interest. As stated above, the spur frequency is determined as $F_{spur}=\text{abs}(i \times F_1 - j \times F_2)$, and the frequency control word supplied to the spur canceller of FIG. 3 is $$\frac{F_{spur}}{Fxo}.$$

Control logic 640 may utilize a state machine to configure and control the computation engine to automatically provide FCWs corresponding to the selected signals of interest. Alternatively, control logic 640 may utilize a programmed microcontroller to provide the control functionality to configure and control the computation engine. The computation engine may be implemented in hardware, a programmed microcontroller, or a combination.

Figure 8:
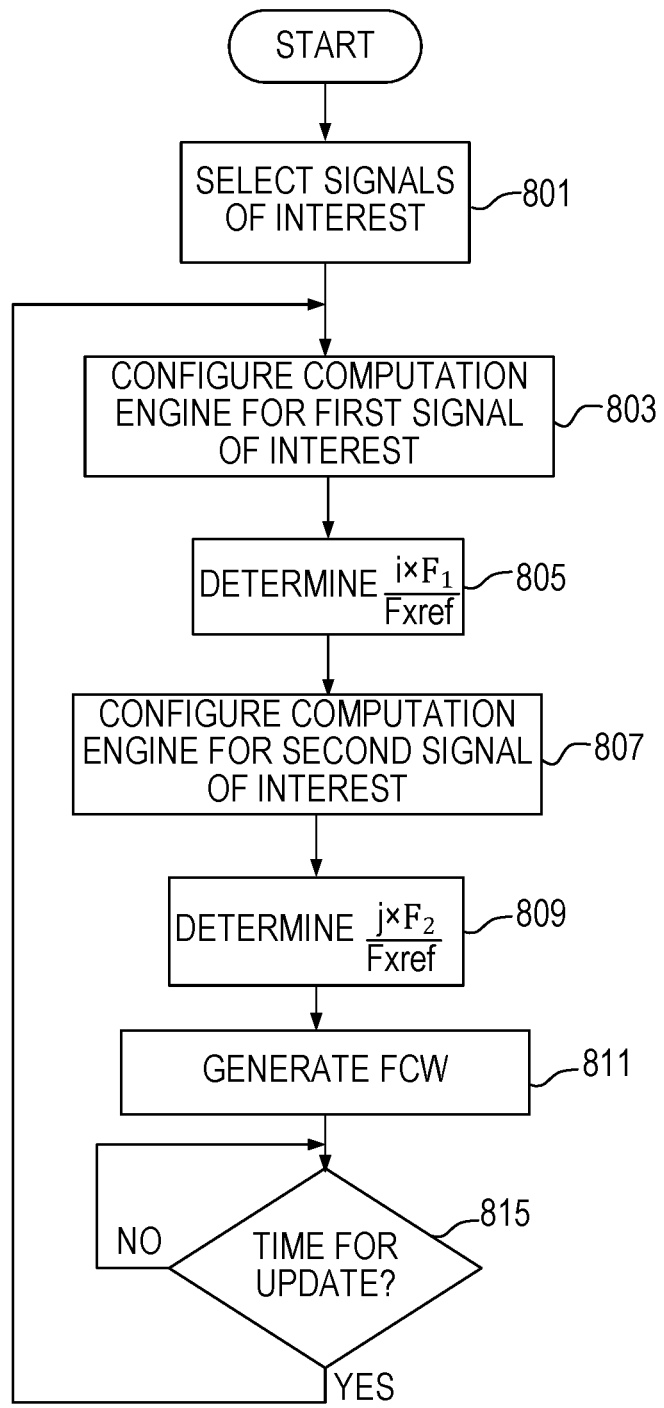
FIG. 8 illustrates a high level flow diagram of an embodiment for updating the spur target frequency automatically.

FIG. 8 illustrates a high level flow of an embodiment for updating the spur target frequency automatically that may be implemented by control logic 640. In 801 the signals of interest are selected including the harmonics of interest. Those signals may be input signals and/or output signals of PLLs that are locked, such as input signals and output signals of the PLLs illustrated in FIG. 4. At 803, the computation engine is configured to operate on the first signal of interest. That includes loading the X and Y registers with fixed values corresponding to fixed divider values and harmonics appropriate for the signal of interest. At 805, the computation engine determines $$\frac{i \times F_1}{F_{xref}}$$

for the first signal of interest. At 807 the computation engine is configured to computer $$\frac{i \times F_2}{F_{xref}}$$

based on the second signal of interest, which configuring includes loading the X and Y registers with fixed values corresponding to fixed divider values and harmonics appropriate for the second signal of interest. Note that there may be separate X and Y registers for each of the signals of interest so the X and Y register don't have to be reloaded each update. In fact, embodiments may utilize duplicate hardware to implement the computation engine so the components of the FCW can be computed simultaneously. At 809, the computation engine determines $$\frac{j \times F_2}{F_{xref}}$$

for the second signal of interest and at 811 generates the frequency control word $$\frac{i \times F_1 - j \times F_2}{F_{xref}}$$

and supplies the spur target to the spur canceller. At 815, a time check is made to see if it is time to update the spur target again. If so, the flow returns to 803 and otherwise waits for the appropriate update time, e.g., 1 microsecond.

Once the spur target is set, embodiments update the settings to compensate for PLL dynamics based on the updated spur target. Referring back to FIG. 2, the phase adjust block 207 receives the updated compensation values to compensate for the PLL dynamics. The updated compensation values are determined using a programmable lookup table. FIG. 9 illustrates an example lookup table. The example of FIG. 9 has nine frequency look-up values (F0-F8), where the frequency corresponds to the FCW. Ten different table value selections (Phase0-Phase9) may be made based on the frequency identified by the FCW. For example, if the computed frequency identified by the FCW, is in the range F4<FCW<=F5, then Phase 5 is selected and squelch 5 is selected. A 3 bit value may be used to select one of eight phases. Additional or fewer bits may be used to select more or fewer phases appropriate to the particular implementation. Squelch is used to disable spur cancellation. Thus, a one bit value may be used to enable or disable spur cancellation. Since the FCW is dynamic, it is possible for squelching to turn on/off based on the divider values. When disabled, the spur cancellation value is forced to zero. When the FCW is <=F0, phase 0 is selected and squelch0 is selected. When the FCW is >F8, phase 9 and squelch 9 are selected Note that embodiments illustrated, e.g., in FIGS. 4 and 6, can be used to adjust spur frequency for a single PLL. For example, assume F2 is set to 0 (from the last line in the table in FIG. 7). Further assume that F1 is based on the output of QDIV through the R divider 426). Thus, the spur is based on $$\frac{i \times F_1 - j \times 0}{F_{xref}}.$$

As can be seen in the table of FIG. 7, the only signal that is not fixed is the value of the feedback divider FBDIV. Thus, in this instance, the approach can be used to adjust the FCW for a spur in an output of PLL 401 supplied by the R divider 426 based on variations in the feedback divider FBDIV.

Thus, various aspects have been described related to automatically updating a spur cancellation target frequency.

The description of the invention set forth herein is illustrative, and is not intended to limit the scope of the invention as set forth in the following claims. Other variations and modifications of the embodiments disclosed herein, may be made based on the description set forth herein, without departing from the scope of the invention as set forth in the following claims.

What is claimed is:

1. A method comprising:
   determining a spur frequency control word in a system with at least two phase-locked loops (PLLs) to cancel a spur at a spur target frequency corresponding to the spur frequency control word;
   determining an updated spur frequency control word based on a change in one or more variable divide ratios associated with at least one of the at least two PLLs;
   cancelling an updated spur at an updated spur target frequency corresponding to the updated spur frequency control word; and
   with the least two PLLs in lock, determining the updated spur frequency control word based at least in part on an absolute value of (iF1−jF2), where i is a harmonic of F1 and j is a harmonic of F2, F1 is a first frequency associated with a first PLL of the at least two PLLs and F2 is a second frequency associated with a second PLL of the at least two PLLs.

2. The method as recited in claim 1, further comprising:
   generating the updated spur frequency control word as the absolute value of (iF1−jF2) divided by a third frequency.

3. The method as recited in claim 2, wherein the third frequency is associated with a reference clock signal supplied to the first PLL.

4. The method as recited in claim 2, wherein generating the updated spur frequency control word further comprises:
   multiplying a first variable feedback divider value by a first constant value identifying, at least in part, a harmonic of the first frequency and generating a first multiplication result, the first variable feedback divider value being associated with the first PLL; and
   dividing the first multiplication result by a first denominator and providing a first division result.

5. The method as recited in claim 4, wherein the first constant value further incorporates a first fixed divider ratio.

6. The method as recited in claim 4, wherein the first denominator is a second constant value or is based on one or more variable divider values.

7. The method as recited in claim 4, further comprising:
   multiplying the first variable feedback divider value associated with the first PLL by a second constant value identifying, at least in part, a harmonic of the second frequency, and providing a second multiplication result;
   dividing the second multiplication result by a second denominator and generating a second division result; and
   subtracting the second division result from the first division result to generate the updated spur frequency control word.

8. The method as recited in claim 7, wherein the second denominator is based on one or more other variable divider values.

9. The method as recited in claim 1, further comprising:
   compensating for spur dynamics by adjusting a phase of a spur frequency cancellation signal based on the updated spur frequency control word.

10. An apparatus comprising:
    a first phase-locked loop (PLL);
    a second PLL configurable to be in lock with the first PLL;
    spur frequency control word update logic to generate a spur frequency control word;
    wherein the spur frequency control word update logic is configured to supply an updated spur frequency control word that differs from the spur frequency control word based on a change in one or more variable feedback divide ratios associated with at least one of the first and second PLLs; and
    wherein the spur frequency control word update logic is configured to determine the updated spur frequency control word based at least in part on an absolute value of (iF1−jF2), where i is a harmonic of a first frequency (F1) and j is a harmonic of a second frequency (F2), F1 is associated with the first PLL and F2 is associated with the second PLL.

11. The apparatus as recited in claim 10, wherein the spur frequency control word update logic is configured to generate the updated spur frequency control word as the absolute value of (iF1−jF2) divided by a third frequency.

12. The apparatus as recited in claim 11, wherein the third frequency is associated with a reference clock signal supplied to the first PLL.

13. The apparatus as recited in claim 11, wherein the spur frequency control word update logic further comprises:
    a multiplier to multiply a first variable feedback divider value by a first constant value identifying a harmonic of the first frequency and generating a first multiplication result, the first variable feedback divider value being associated with the first PLL; and
    divide logic to divide the first multiplication result by a first denominator and provide a first division result.

14. The apparatus as recited in claim 13, wherein the first denominator is a second constant value.

15. The apparatus as recited in claim 13, wherein the first denominator is based on one or more variable divider values.

16. The apparatus as recited in claim 13, the spur frequency control word update logic further comprises:
    subtraction logic to subtract a second division result from the first division result to generate the updated spur frequency control word, the second division result corresponding to jF2 divided by the third frequency;
    wherein the spur frequency control word update logic is configured to determine the second division result by dividing a second multiplication result by a second denominator, the second multiplication result being determined by multiplying the first variable feedback divider value by a second constant value, and wherein determining the second division result further includes dividing the second multiplication result by a second denominator to provide the second division result.

17. The apparatus as recited in claim 16, wherein the second constant value is the same as the first constant value.

18. The apparatus as recited in claim 16, wherein the second denominator is a constant value.

19. The apparatus as recited in claim 16, wherein the second denominator is based on one or more other variable divider values.

20. A method comprising:
    periodically determining a spur frequency control word to cancel a spur at a frequency corresponding to the spur frequency control word using a spur cancellation circuit in a first phase-locked loop (PLL) in a system with at least a second PLL that is in lock with the first PLL; and
    utilizing one or more first divide ratios of one or more first dividers of the first PLL and one or more second divide ratios of one or more second dividers of the second PLL to periodically determine the spur frequency control word, the spur frequency control word changing responsive to a change in one or more of the one or more first divide ratios, the spur frequency control word changing responsive to a change in one or more of the one or more second divide ratios, and the spur frequency control word changing responsive to a change in both one or more of the one or more first divide ratios and a change in one or more of the one or more second divide ratios.

21. An apparatus comprising:

a first phase-locked loop (PLL);

a second PLL in lock with the first PLL;

a spur cancellation circuit to cancel a spur in the first PLL at a frequency based on a spur frequency control word;

spur frequency control word update logic to periodically update the spur frequency control word; and wherein the spur frequency control word update logic utilizes one or more first divide ratios of one or more first dividers of the first PLL and one or more second divide ratios of one or more second dividers of the second PLL to periodically determine the spur frequency control word, the spur frequency control word changing responsive to a change in one or more of the one or more first divide ratios, the spur frequency control word changing responsive to a change in one or more of the one or more second divide ratios, and the spur frequency control word changing responsive to a change in both one or more of the one or more first divide ratios and a change in one or more of the one or more second divide ratios.

* * * * *